United States Patent [19]

Kuroda et al.

[11] Patent Number: 5,041,392
[45] Date of Patent: Aug. 20, 1991

[54] METHOD FOR MAKING SOLID STATE IMAGE SENSING DEVICE

[75] Inventors: Takao Kuroda, Ibaraki; Toshihiro Kuriyama, Nagaokakyo; Kenju Horii, Ohtsu; Hiroyuki Mizuno, Takarazuka, all of Japan

[73] Assignee: Matsushita Electronics Corporation, Kadoma, Japan

[21] Appl. No.: 544,620

[22] Filed: Jun. 27, 1990

Related U.S. Application Data

[60] Division of Ser. No. 251,026, Sep. 26, 1988, Pat. No. 4,947,224, which is a continuation of Ser. No. 788,873, Oct. 18, 1985, abandoned.

[30] Foreign Application Priority Data

Oct. 18, 1984 [JP] Japan ................. 59-220016
Mar. 29, 1985 [JP] Japan ................. 60-63369

[51] Int. Cl.$^5$ ........................... H01L 31/18
[52] U.S. Cl. ........................... 437/3; 437/2; 437/53
[58] Field of Search ............. 357/24 LR, 29, 30 D, 357/30 F, 30 G; 437/3, 2, 53

[56] References Cited

U.S. PATENT DOCUMENTS

| 3,838,439 | 9/1974 | Biard ........................ 357/30 |
| 4,527,182 | 7/1985 | Ishihara et al. ........... 357/24 LR |
| 4,630,091 | 12/1986 | Kuroda et al. ........... 357/30 F |
| 4,663,771 | 5/1987 | Takeshita et al. ........ 357/30 G |

FOREIGN PATENT DOCUMENTS

| 2447289 | 4/1975 | Fed. Rep. of Germany .... 357/30 F |
| 2744023 | 4/1978 | Fed. Rep. of Germany ........ 357/29 |
| 3326924 | 2/1984 | Fed. Rep. of Germany ........ 357/24 LR |
| 0132183 | 10/1979 | Japan ........................... 357/30 G |
| 0156358 | 12/1980 | Japan ........................... 357/29 |
| 8202761 | 2/1984 | Netherlands ................... 357/30 F |

OTHER PUBLICATIONS

Control of Blooming in CC Imagers; Kosonocky et al., 6/76; pp. 1–23.

*Primary Examiner*—Brian E. Hearn
*Assistant Examiner*—Michael Trinh
*Attorney, Agent, or Firm*—Cushman, Darby & Cushman

[57] ABSTRACT

In a solid state image sensing device of p-conductivity type well, photo-electro converting region (1) are configurated to have larger area as depth increases, so that excessive electric charges generated in the p-conductivity type well are easily transferred from expanded peripheral parts (7) at the bottom (1b) to channel (3), without being undesirably transferred downward through thin p-conductivity type region 6 to substrate (4), and smear electric charges which has been generated in a thin p-conductivity type well under the photo-electro converting region in the conventional device is suppressed, to effectively decrease the smear phenomenon.

2 Claims, 2 Drawing Sheets

METHOD FOR MAKING SOLID STATE IMAGE SENSING DEVICE

FIELD OF THE INVENTION AND RELATED ART STATEMENT

1. Field of the Invention

The present invention relates generally to a solid state image sensing device and method for making the same and particularly to a solid state image sensing device of p-conductivity type well structure.

2. Description of the Prior Art

In recent years, large improvements in the characteristics of solid state image sensing devices has been made, especially devices of inter line transfer type CCD show superior characteristics than conventional image pick up tubes. Even in such improved solid state image sensing device however, so called smear phenomenon, which is caused by mixing of a part of electric charges generated by incident light into the transfer means, has not been eliminated. Smear phenomenon is, therefore, the important problem to be solved. In order to improve the smear phenomenon, a p-conductivity type well structure is considered effective.

A solid state image sensing device having the p-conductivity type well structure is, for instance, disclosed in 1983 IEEE International Solid-State circuits Conference Friday Feb. 25, 1983. SESSION XVIII, FAM18.7 p264-265. However, the conventional solid state image sensing device, even though having the p-conductivity type well structure, has such shortcomings which do not sufficiently eliminate the smear phenomenon. Also, the sensitivity for long wavelength light is low because photo-electro converting regions thereof are shaped undesirably. Furthermore, because the area of the thin p-conductivity type well design which is underneath the photo-electro region is small, elimination of blooming phenomenon is insufficient.

OBJECT AND SUMMARY OF THE INVENTION

One object of the present invention is to provide a solid state image sensing device wherein smear phenomenon is drastically decreased.

A second object of the present invention is to provide a solid state image sensing device wherein blooming phenomenon is sufficiently suppressed.

A third object of the present invention is to provide a solid state image sensing device which has high sensitivity.

Still another object of the present invention is to provide a solid state image sensing device which is highly integrated.

These and other objects are accomplished by a solid state image sensing device comprising the following structure.

A semiconductor layer is formed on a semiconductor substrate.

At least one photo-electro converting region is formed in the semiconductor layer.

At least one gate electrode is formed on the semiconductive layer.

At least one vertical transfer means is disposed away from the photo-electro converting region. Electric charges generated from the photo-electro converting region upon irradiation of light thereto are transferred to the vertical transfer means when electric potential is applied on the gate electrode.

The photo-electro converting region has a shape in which the size of the top portion thereof is smaller than that of the bottom portion.

With respect to the method for making the solid state image device in accordance with the present invention, a first object of the invention is to provide a method for making a solid state image sensing device wherein smear phenomenon is drastically decreased.

A second object of the present invention is to provide a method for making solid state image sensing device wherein blooming phenomenon is alleviated.

A third object of the present invention is to provide a method for making a solid state image sensing device which has high sensitivity.

Still another object of the present invention is to provide a method for making a solid state image sensing device is highly integrated.

These and other objects are accomplished by a method for making solid state image sensing device comprising the steps.

A first layer of a first conductivity type is formed on a semiconductor substrate of a second conductivity type.

A second layer of a said second conductivity type is then formed on said first layer.

An impurity of said first conductivity type from the surface of said second layer, is then selectively introduced thereby forming a third layer of said first conductivity type. This results in at least one photo-electro converting region surrounded by first and third layers of said first conductivity type.

In a specific embodiment, the first semiconductor layer or the second semiconductor layer is formed by the introduction of impurities.

In another specific embodiment, the first semiconductor layer or the second semiconductor layer is formed using an epitaxial growth method.

This invention has various advantages among which are the following.

The invention can provide a solid state image sensing device wherein smear phenomenon is drastically decreased, and also a method for making the same.

The invention can provide a solid state image sensing device wherein blooming phenomenon is alleviated.

The invention can provide a solid state image sensing device which has high sensitivity.

The invention can provide a solid state image sensing device which is highly integrated.

While the novel features of the invention are set forth with particularity in the appended claims, the invention both as to organization and content will be better understood and appreciated, along with other objects and features thereof, from the following detailed description of the preferred embodiment taken in conjuction with the drawings.

DESCRIPTION OF THE PREFERRED EMBODIMENTS

The solid state image sensing device and method for making the same are described hereunder in connection with a few preferred embodiments and by reference to the accompanying drawings.

Figure 1:
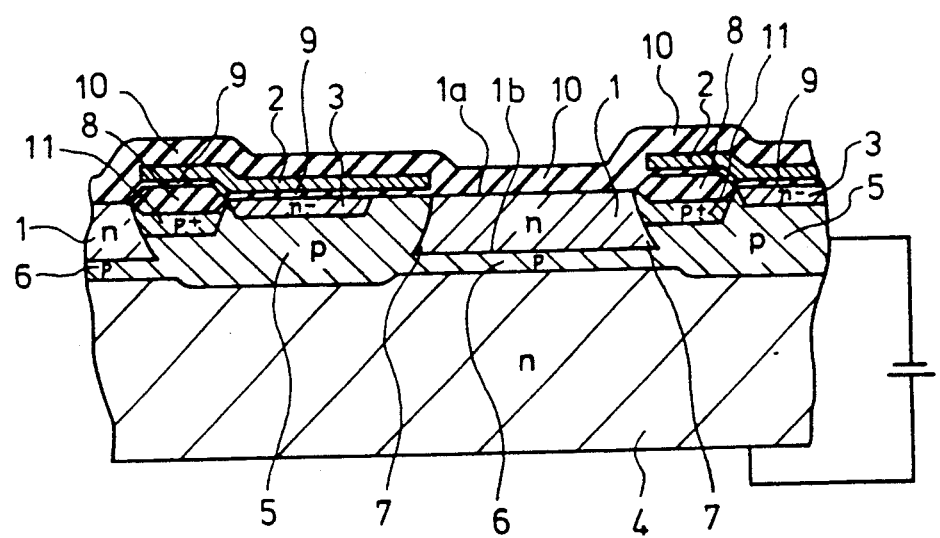
FIG. 1 is a cross sectional view showing a preferred embodiment of a solid state image sensing device in accordance with the present invention.

FIG. 1 shows a cross-sectional view of a preferred embodiment of the solid state image sensing device. Each unit of the device has on a semiconductor substrate 4, for instance, of silicon, a p-conductivity type well 5 and therein a photo-electro converting region 1 which receives light incident thereto and issues electrons corresponding to the amount of input light. The p-conductivity type well 5 also has vertical transfer means, for example, a vertical CCD channel region 3 wherethrough the electrons accumulated in the photo-electro converting region 1 are transferred outside the circuit by application of a control signal on gate electrode 2 formed on the vertical CCD channel 3. A reverse bias voltage is impressed across the n-conductivity type substrate 4 and the p-conductivity type well layer which comprises thick part 5 and thin parts 6, thereby is suppressed blooming phenomenon. The gate electrode 2 is formed on an insulation film, for instance, thin $SiO_2$ film 9, in a manner to be insulated from the vertical CCD channel region 3.

As shown in FIG. 1, the photo-electro converting region 1 is configured to have larger area in lower part than smaller area in upper part. That is, peripheral parts 7 of the photo-electro converting region 1 are formed being bent toward the vertical CCD channel 3. Therefore, the distance between the photo-electro converting region 1 and the vertical CCD channel 3 is narrower than the corresponding parts in the conventional solid state image sensing device with a p-conductivity type well, and a depression layer which is on the interface between the p-conductivity type well 5 and the photo-electro converting region 1 extend towards the vertical CCD channel 3.

As a result of the above-mentioned configuration, electric charges generated in the p-conductivity type well region 5 due to oblique incident light on the photo-electro converting region 1 is reduced. Furthermore, smear electric charges generated in the p-conductivity type well 5 by the oblique incident light through the photo-electro converting region 1 decrease and are instead easily captured by the photo-electro converting region 1. Accordingly, electric charges undesirably captured by the vertical CCD channel 3 are reduced. Therefore smear phenomenon is drastically reduced.

The configuration of the photo-electro converting region 1 has a wider area in the lower part and the widest area is this lower part. Therefore, the thin p-conductivity type area 6 formed between the substrate part 4 and the photo-electro converting part 1 has a wide area. Therefore, excessive electric charges generated in the photo-electro converting region 1 are effectively evacuated by the punch-through effect between the thin part of the p-conductivity type well 6 and the n-conductivity type substrate 4 and the reversely biased photo-electro converting region 1. Therefore, blooming phenomenon, previously generated by electric charges travelling towards the n-region 3, is effectively suppressed.

Figure 2:
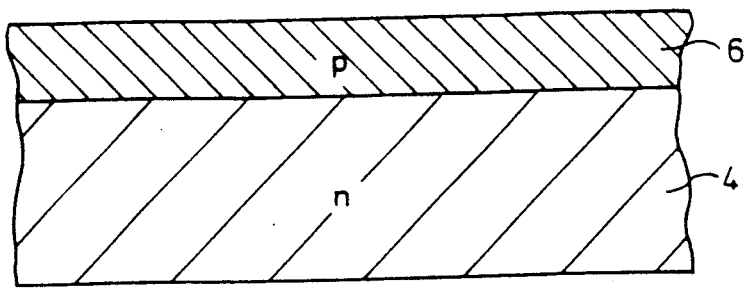
FIG. 2(a), FIG. 2(b), FIG. 2(c) and FIG. 2(d) are cross-sectional views showing progression of manufacturing steps of the solid state image sensing device embodying method for making in accordance with the present invention.
Figure 2:
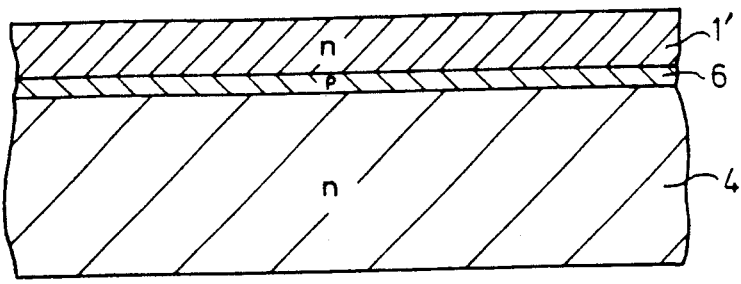
Figure 2:
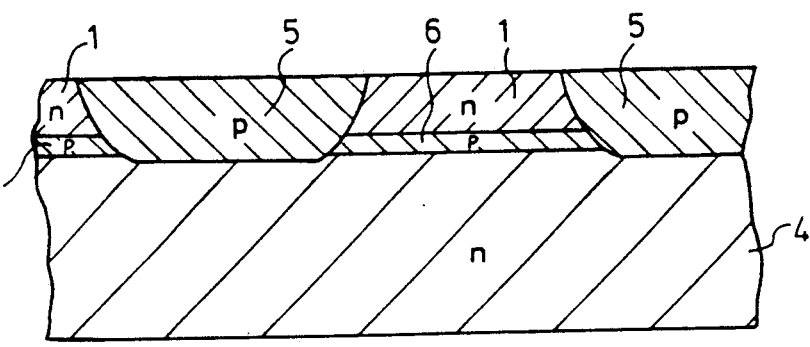
Figure 2:
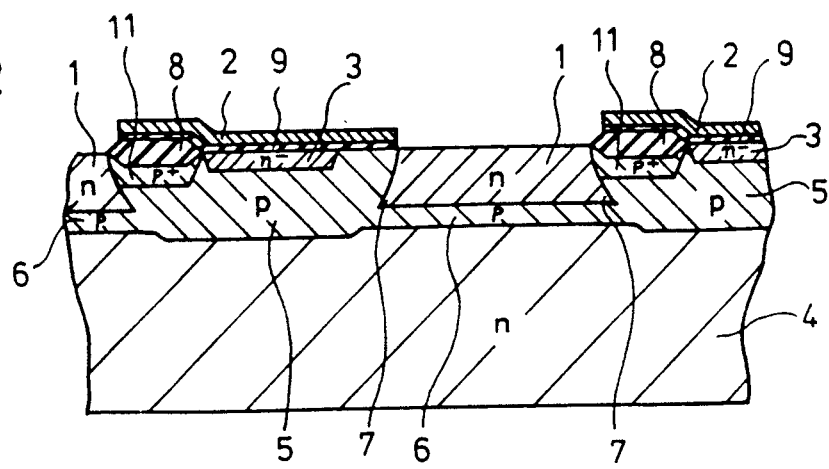

FIG. 2(a), FIG. 2(b), FIG. 2(c) and FIG. 2d) show a progression of manufacturing steps for one embodiment of the manufacturing process in accordance with the present invention. First, as shown in FIG. 2(a), on an n-conductivity type silicon substrate 4, by means of thermal diffusion followed by a heat treatment or by means of ion-implantation followed by a heat treatment, a p-conductivity type impurity doped layer 6 is formed. As the impurity, for instance, B is usable. Next, in a similar way an n-conductivity type impurity doped layer 1 is formed on the impurity doped layer 6, as shown in FIG 2(b). Thereafter, as shown in FIG. 2(c), a p-conductivity type impurity, for instance, B, having a round boundary face (i.e., diffused front) is selectively diffused from the surface of the n-conductivity type impurity doped layer 1 to such a depth to reach the underlying p-conductivity type impurity doped layer 6, thereby to form p-conductivity type impurity diffused regions 5.

In the above-mentioned ion-implantation, by appropriately selecting ions of appropriate diffusion coefficients and appropriate temperatures of heat treatment, ion-implanting materials, for making the p-conductivity type impurity doped layer 6, the n-conductivity type impurity doped layer 1 and the p-conductivity type purity doped layer 5, and by subsequently making only one heat treatment, selected diffused regions 5 are formed in a smaller number of steps.

For instance, by appropriate amount of p impurity ions, for instance, $1 \times 10^{12}$ cm$^{-2}$ of B ions and an appropriate amount of n-conductivity type impurity ions, for instance, $0.8 \times 10^{12}$ cm$^{-2}$ of As, and subsequently carrying out one heat treatment on these implanted impurities, because of the difference of diffusion coefficients between As ions and B ions, the configuration of FIG. 2(b) is obtainable, wherein the B-diffused layer 6 becomes deeper than As-diffused layer 1'.

Thereafter, known methods can be used to form $p^+$-conductivity type channel stopper regions 11 by ion-implantation of B, isolation regions 8 made of oxide film and vertical CCD channels 3 of n-conductivity type made by diffusing As. Thin oxide insulation film 9 covering the p-conductivity type diffused regions 5 and the oxide insulation film 8 as well as transfer electrodes 2 made of polycrystalline silicon are formed using known steps, the result being shown in FIG. 2(d). Heat treatments necessary to form these regions can be the same type of heat treatments used to form the p-conductivity type of region 6, the n-conductivity type region 1 and the p-conductivity type region 3. If the p-conductivity type impurity layer 6 and n-conductivity type impurity doped layer 1 are formed by known epitaxial growth method the thicknesses of these layers can be controlled and the results obtained are satisfactory.

According to one manufacturing method embodying the present invention, since the photo-electro converting regions 1, are formed to have a shape of larger area at the bottom 1b than surface part 1a, smear phenomenon observed in prior solid state image sensing devices is prominently decreased.

In the solid state image sensing device of the p-conductivity type well construction, such as the present invention, it is important to evacuate the excessive electric charge from the photo-electro converting region 1 through the thin p-conductivity type purity doped layer 6 under the photo-electro converting region 1 by utilizing layer 6 as a channel to the n-conductivity type substrate 4 to suppress the so called blooming phenomenon.

However, since the thin p-conductivity type impurity doped layer 6 becomes the channel for the evacuation of the electric charges, the ability to suppress the blooming becomes proportional to the area of the thin p-conductivity type doped layer 6.

Since the lateral diffusion front of the p-conductivity type purity doped region 5 is accurately controllable, the area of the thin p-conductivity type impurity doped region 6 can be controlled accurately and there is no fear of unduly narrowing the area. Thus, suppression of blooming is assured. The suppressing of the blooming phenomenon is also assured even if the image sensing device is highly integrated.

Furthermore, according to the manufacturing method of the present invention, since the thin p-conductivity type impurity doped region 6 is disposed in a deep position from the surface of the wafer, the device has a high sensitivity even for a long wavelength light, and hence, a solid state image sensing device having a high sensitivity wide range of wavelength is manufacturable.

Furthermore, apart from the above-mentioned embodiment, wherein the peripheral boundary of the n-conductivity type region expands monotonously with the depth, the manner of the expanding of this peripheral boundary need not necessarily be monotonous, but some little waving of the peripheral boundary is admissible as long as the boundary face is generally a surface of a substrate.

Apart from the above-mentioned embodiment where CCD type solid state image sensing device is described, the present invention is also applicable to MOS type solid state image sensing devices. Furthermore, the invention is applicable for solid state image sensing devices of one dimensional and two dimensional types.

While specific embodiment of the invention have been illustrated and described herein, it is realized that modification and changes will occur to those skilled in the art. It is therefore to be understood that the appended claims are intended to cover all modifications and changes as fall within the true spirit and scope of the invention.

We claim:

1. Method for making a solid state image sensing device comprising the steps of:

forming a first layer of a first conductivity type on a semiconductor substrate of a second conductivity type which is opposite to said first conductivity type;

forming a second layer of said second conductivity type on said first layer;

selectively introducing an impurity of said first conductivity type from a surface of said second layer to reach said first layer where it is underlying said second layer, for forming at least two impurity diffused regions of said first conductivity type, resulting in at least one photoelectric converting region which is surrounded by said first layer and two of said impurity diffused regions of said first conductivity type, said selectivity introducing step forming said photoelectric converting region of a shape to have a larger horizontal section at a lower portion than at an upper portion to reduce smearing phenomena;

forming at least one charge transfer region on said impurity diffused regions; and forming at least one gate electrode above said impurity diffused regions and said charge transfer region.

2. Method for making solid state imaging sensing device in accordance with claim 1, wherein said substrate is of an n-conductivity type, said first layer is of a p-conductivity type and said photo-electro converting region is of n-conductivity type.

* * * * *